United States Patent
Steigerwald et al.

(10) Patent No.: US 6,933,535 B2
(45) Date of Patent: Aug. 23, 2005

(54) LIGHT EMITTING DEVICES WITH ENHANCED LUMINOUS EFFICIENCY

(75) Inventors: Daniel A. Steigerwald, Cupertino, CA (US); William D. Collins III, San Jose, CA (US); Robert M. Fletcher, San Jose, CA (US); Michael J. Ludowise, San Jose, CA (US); Jason L. Posselt, San Jose, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 35 days.

(21) Appl. No.: 10/699,433

(22) Filed: Oct. 31, 2003

(65) Prior Publication Data

US 2005/0093007 A1   May 5, 2005

(51) Int. Cl.[7] ............................................. H01L 33/00
(52) U.S. Cl. ........................... 257/89; 257/79; 257/94; 257/95; 257/98; 257/99; 257/100; 257/103; 313/501; 313/502; 313/503
(58) Field of Search ............................. 257/79, 89, 94, 257/95, 98–100, 103; 313/110, 112, 483, 313/489, 486, 467, 501, 503, 506, 509, 510, 313/512

(56) References Cited

U.S. PATENT DOCUMENTS

| | | | |
|---|---|---|---|
| 5,847,507 A | 12/1998 | Butterworth et al. ....... | 313/512 |
| 5,959,316 A * | 9/1999 | Lowery ......................... | 257/98 |
| 6,274,924 B1 | 8/2001 | Carey et al. ................. | 257/676 |
| 6,351,069 B1 | 2/2002 | Lowery et al. .............. | 313/512 |
| 6,417,019 B1 | 7/2002 | Mueller et al. ............... | 438/29 |
| 6,501,102 B2 | 12/2002 | Mueller-Mach et al. ...... | 257/84 |
| 6,576,930 B2 | 6/2003 | Reeh et al. ................... | 257/98 |
| 6,806,658 B2 * | 10/2004 | Tan et al. .................... | 315/291 |

OTHER PUBLICATIONS

P. Schlotter et al., "Fabrication and characterization of GaN/InGaN/AlGaN double heterostructure LEDs and their application in luminescense conversion LEDs (LU-COLEDs)".

* cited by examiner

Primary Examiner—Andy Huynh
(74) Attorney, Agent, or Firm—Patent Law Group LLP; Rachel V. Leiterman

(57) ABSTRACT

A structure includes semiconductor light emitting device and a wavelength converting layer. The wavelength converting layer converts a portion of the light emitted from the semiconductor light emitting device. The dominant wavelength of the combined light from the semiconductor light emitting device and the wavelength converting layer is essentially the same as the wavelength of light emitted from the device. The wavelength converting layer may emit light having a spectral luminous efficacy greater than the spectral luminous efficacy of the light emitted from the device. Thus, the structure has a higher luminous efficiency than a device without a wavelength converting layer.

21 Claims, 5 Drawing Sheets

LIGHT EMITTING DEVICES WITH ENHANCED LUMINOUS EFFICIENCY

BACKGROUND

1. Field of Invention

This invention relates to semiconductor light emitting devices wherein a small portion of light emitted from the device is converted by a wavelength converted material.

2. Description of Related Art

The luminous efficiency of a light source is expressed in lumens per watt and is a measure of how efficiently the light source converts electrical power to luminous flux or brightness. For a given brightness, a device with high luminous efficiency requires less electrical power than a device with lower luminous efficiency. Thus, a device with high luminous efficiency may be less expensive to operate at a given brightness than a device with lower luminous efficiency.

SUMMARY

In accordance with embodiments of the invention, a light emitting structure includes a semiconductor light emitting device and a wavelength converting layer. The wavelength converting layer converts a portion of the light emitted from the device. The dominant wavelength of the combined light from the device and the wavelength converting layer is essentially the same as the wavelength of light emitted from the device. The wavelength converting layer may emit light having a spectral luminous efficacy greater than the spectral luminous efficacy of the light emitted from the device. Thus, the structure has a higher luminous efficiency than a device without a wavelength converting layer.

DETAILED DESCRIPTION

In accordance with an embodiment of the invention, the luminous efficiency of a semiconductor light emitting device such as a light emitting diode is enhanced by converting the wavelength of a small portion of the light emitted from the light emitting device. The wavelength of the portion of light emitted by the light emitting device is converted by a wavelength converting material such as a fluorescent material, quantum dots, or phosphor to a wavelength having a higher spectral luminous efficacy. The combined light emitted from the light emitting device and the wavelength converting material is essentially the same color (i.e., same dominant wavelength) as the light from the light emitting device, but with a higher spectral luminous efficacy.

Figure 2:
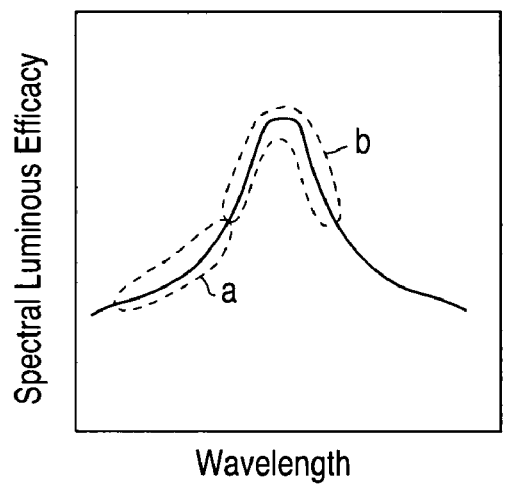
FIG. 2 is a plot of spectral luminous efficacy of light as a function of wavelength.

Spectral luminous efficacy is the sensitivity of the average human retina to light of various colors and is expressed in lumens per optical watt. FIG. 2 illustrates the spectral luminous efficacy of light as a function of wavelength for the visible spectrum. Greenish yellow light having a wavelength of about 555 nm has the highest spectral luminous efficacy. Blue light and red light have relatively low spectral luminous efficacy. In embodiments of the present invention, the peak wavelength of light from the light emitting device may be in wavelength range a, from about 400 to about 480 m and usually between about 420–430 nm and about 460 nm. The peak wavelength of light emitted by the wavelength converting material may be in wavelength range b, from about 500 to about 620 nm. The color of light produced by the wavelength converting material generally does not matter, as the amount of light emitted by the wavelength converting material is small enough that it does not significantly impact the color of the combined light. Generally, the light emitting device and the wavelength converting material are selected such that the light emitted from the wavelength converting material has a spectral luminous efficacy greater or equal to twice the spectral luminous efficacy of the light emitted from the light emitting device. In addition, the wavelength converting material is selected such that the conversion of light from the light emitting device to light from the wavelength converting material is a downward conversion in energy.

Figure 3:
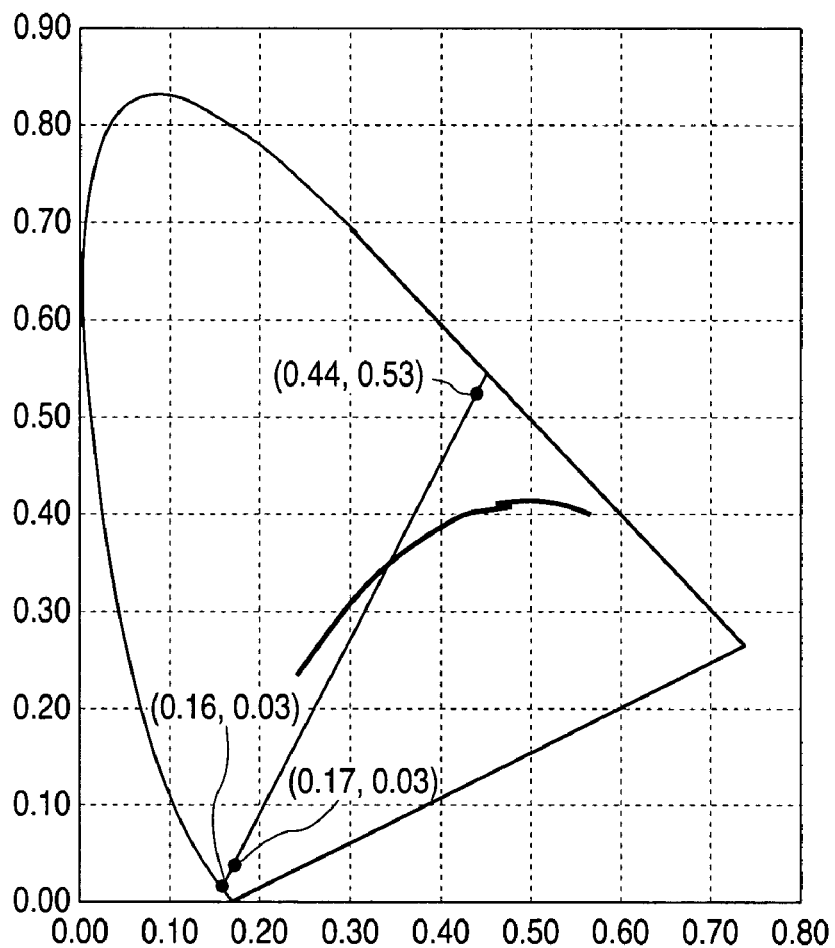
FIG. 3 is a chromaticity diagram illustrating an embodiment of the present invention.

The portion of light converted by the wavelength converting material is small enough that the impact on the spectral purity of the resulting light is minimal. FIG. 3 is a chromaticity diagram. Colors along the edge of the chromaticity graph are pure colors, meaning they have a spectral purity of 100%. In the case of red, green, and blue light combined to make white light, the higher the spectral purity of the red, green, and blue sources, the larger the fraction of colors that can be generated by the combination of the high-purity sources. Semiconductor light emitting devices generally produce light of high spectral purity. The wavelength converting material is selected and incorporated into the device such that the combined light is close to the edge of the chromaticity graph. The combined light may have a spectral purity greater than or equal to about 50%, and generally has a spectral purity greater than or equal to about 90%.

The example of a flip chip III-nitride light emitting device with a praseodymium and cerium doped yttrium aluminum garnet (YAG) phosphor used as the wavelength converting layer is considered below. However, any suitable light emitting device capable of emitting light in wavelength range a of FIG. 2 may be used. For example, in addition to flip chip III-nitride light emitting devices, III-phosphide devices, devices of other materials systems, devices in an epitaxy-up orientation, and devices with contacts formed on opposite sides may be used. In some embodiments, the light emitting device itself may be a wavelength-converted light emitting device; for example, a device that emits ultraviolet light combined with a phosphor layer that absorbs the ultraviolet light and emits light in wavelength range a of FIG. 2. In such embodiments, the two wavelength converting materials, i.e. the first wavelength converting material that absorbs light from the device and emits light in range a and the second wavelength converting material that emits light in range b, either by absorbing light from the device or by absorbing light from the first wavelength converting material, may be mixed in a single layer or may be formed in multiple discrete layers in the path of light emitted from the device.

Any suitable wavelength converting material capable of emitting light with a peak wavelength in wavelength range b of FIG. 2 when pumped with light from wavelength range a, or when pumped with light from a shorter wavelength source in the case where the light in range a is produced by an additional wavelength converting material, may be used to produce the light with a peak wavelength in range b. For example, in addition to Pr and Ce doped YAG, YAG: Ce. SrGaS:Eu, (Ca,Sr)S:Eu, CaS:Ce+Mn, (Sr,Li)SiO:Eu, (Ba, Sr)SiO:Eu, and SrSiN:Eu phosphors may be used, or dyes such as Coumarin 6, Fluorol 7GA, Rhodamine 110, and Lumogen dyes available from BASF. Examples of suitable dyes are described in more detail in U.S. Pat. No. 5,847,507, which is incorporated herein by reference. In some embodiments, it may be desirable for the wavelength converting material to show excellent thermal stability such that the device can operate at high temperatures.

Figure 1:
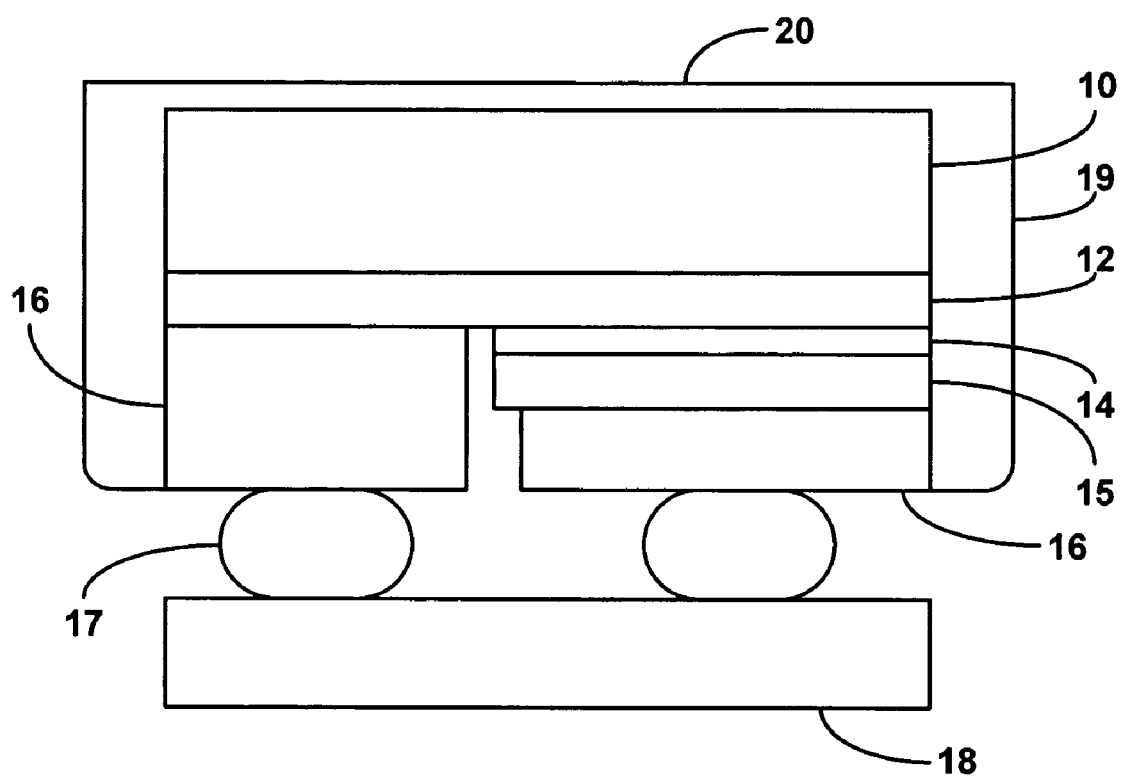
FIG. 1 illustrates an embodiment of the present invention.

FIG. 1 illustrates a light emitting diode according to an embodiment of the invention. The diode shown in FIG. 1 is formed by depositing an n-type region 12 over a substrate 10. A light emitting or active region 14 is formed over n-type region 12 and a p-type region 15 is formed over active region 14. N-type region 12, active region 14, and p-type region 15 have the chemical formula $Al_xIn_yGa_zN$, where $0 \leq x \leq 1$, $0 \leq y \leq 1$, $0 \leq z \leq 1$, $x+y+z=1$. Each of n-type region 12, active region 14, and p-type region 15 may be a single layer or multiple layers of the same or different composition, thickness, and dopant concentration. A portion of p-type region 15 and active region 14 is removed and contacts 16 are formed on the remaining portion of p-type region 15 and the exposed portion of n-type region 12. The chip is then flipped over and mounted on a submount 18 by interconnects 17. A phosphor layer 19 of YAG:Ce+Pr or YAG:Ce is deposited on the chip.

Since phosphor layer 19 is not intended to convert so much light that it substantially alters the color of light emitted from the active region, phosphor layer 19 must have less phosphor than, for example, a phosphor layer in a device intended to emit white light. There are several ways to control the amount of phosphor in phosphor layer 19 such that the correct amount of light is converted by the phosphor layer. In the embodiment illustrated in FIG. 1, a conformal coating of phosphor is deposited, on the top and sides of the light emitting device die, then most of the phosphor is scraped off the top of the light emitting device die, leaving a thin layer of phosphor 20 on the top of the die and thick layers 19 on the sides of the die. The thickness of side layers 19 may be, for example, 25 microns, while the thickness of top layer 20 may be, for example about 5 microns.

In other embodiments, a uniform thin layer of phosphor having a thickness ranging between about 1 and about 10 microns may be deposited by any suitable technique including, for example, screen printing, stenciling, or electrophoretic deposition. In other embodiments, a uniform thick layer of phosphor mixed with silicate or a suitable mix of other metal oxides and/or metal nitrides may be deposited by any suitable technique. The uniform thick layer of phosphor may have a thickness ranging between about 5 and about 50 microns. The silicate may be selected such that its index of refraction matches the index of an encapsulant overlying the die within the package, in order to minimize losses due to scattering. The ratio of phosphor to silicate is controlled such that the appropriate portion of light emitting from the die is converted by the phosphor. In other embodiments, the light emitting device die is only partially covered with a phosphor layer. The entire die may be coated, then portions of the phosphor coating may be removed in a lithography step to create small features, or to provide a ring of phosphor around the die. In still other embodiments, phosphor is dispersed in an encapsulating material such as epoxy or silicone used to fill the space between the die and a reflector cup or lens. In some embodiments the phosphor is adjacent to the die, while in other embodiments the phosphor is separated from the die by other materials.

In embodiments where the wavelength converting material is a dye rather than a phosphor, the dye may be incorporated in a gel that is deposited on the light emitting device die. Alternatively, the dye may be incorporated on the inner or outer surface of a lens overlying the light emitting device die, or within the material forming the lens.

In one example, the device illustrated in FIG. 1 emits blue light having a wavelength of about 451.5. The coordinates (0.16, 0.02) of the light emitted by the die are illustrated on the chromaticity diagram in FIG. 3. The blue light pumps a YAG:Ce+Pr phosphor emitting yellow light having coordinates (0.44, 0.53). By varying the fraction of blue light converted into yellow light, devices with coordinates along the tie line between the blue and yellow points can be created. In the present example, the device was created by removing most of a thick phosphor layer deposited on the top of the die, resulting in a device emitting light having coordinates (0.17, 0.03). The spectral luminous efficacy of the blue light is about 25 lm/W, but the small amount of yellow light has a spectral luminous efficacy of about 500 lm/W, resulting in a 60% increase in luminous efficiency, from 3.9 lm/W in a blue device without any phosphor conversion, to 6.1 lm/W in the present example. The spectral purity was reduced from 100% for a blue device without any phosphor conversion to 95% in the present example.

Figure 4A:
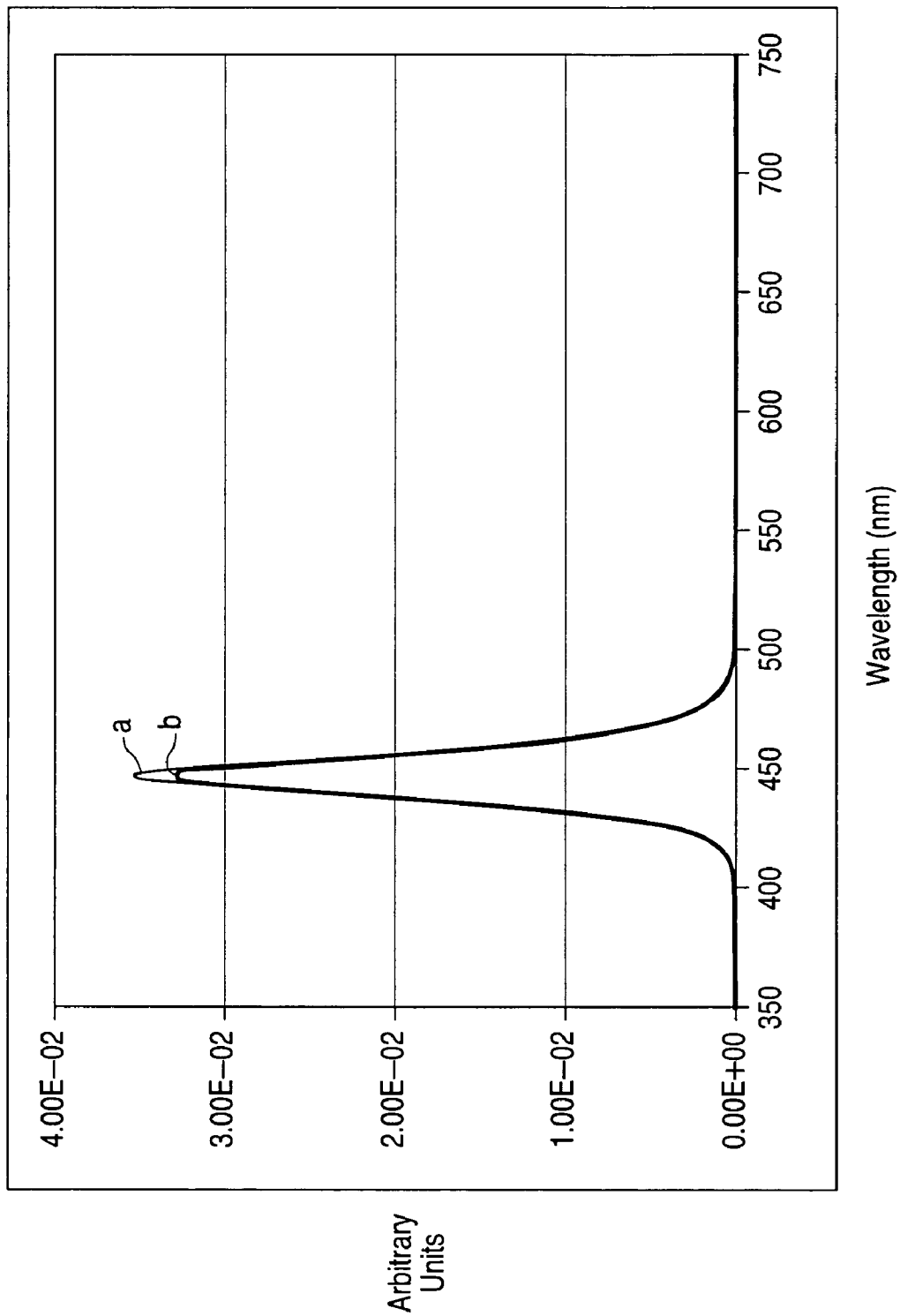
FIGS. 4A and 4B are emission spectra of an embodiment of the present invention.
Figure 4B:
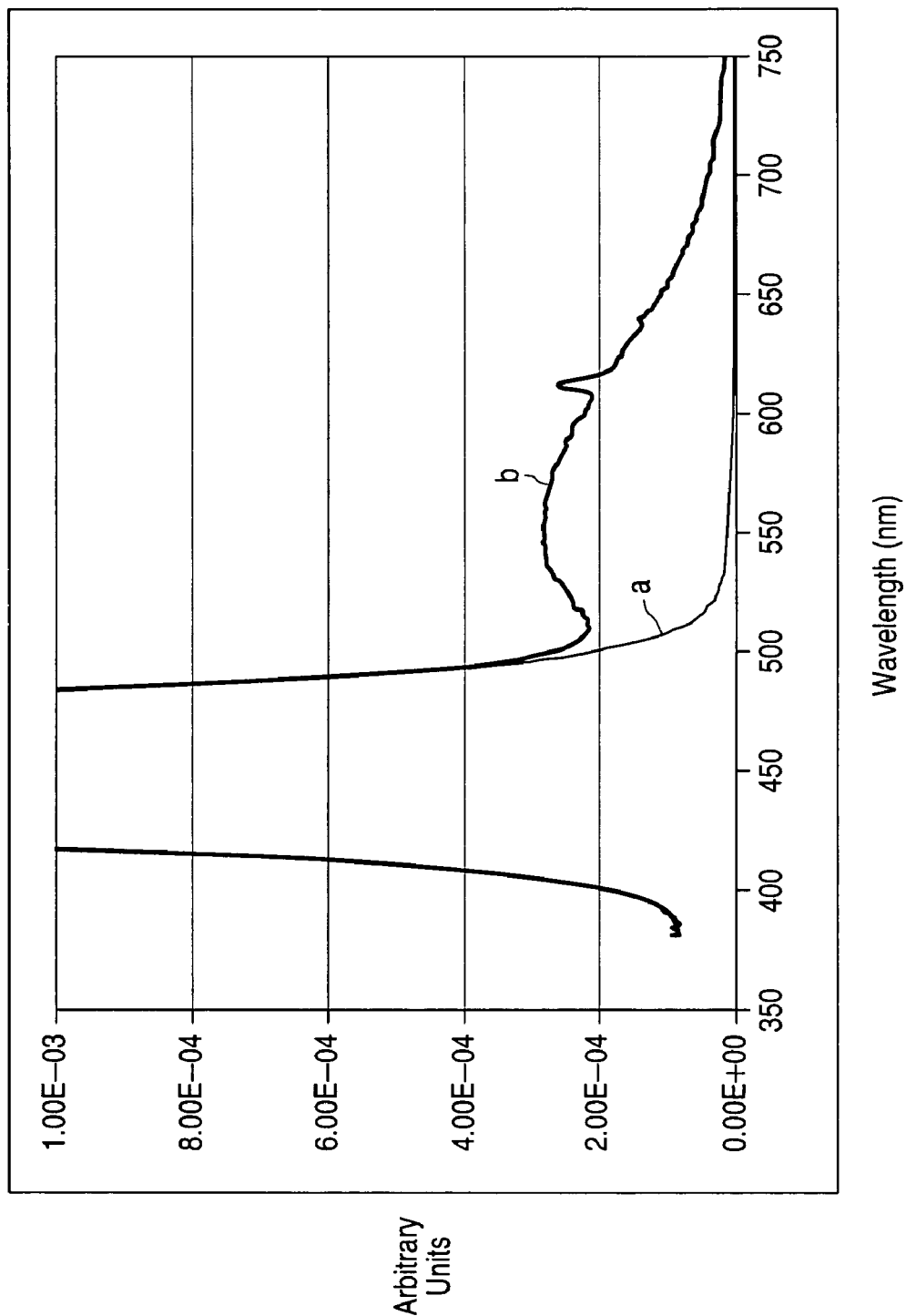

FIG. 4A illustrates emission spectra of the device incorporating a phosphor layer according to an embodiment of the present invention compared to a blue device without phosphor conversion. FIG. 4B illustrates the lower portion of the spectra in FIG. 4A. Device b includes the phosphor layer, while device a does not. As is clear from FIG. 4A, the two devices have almost identical emission spectra. The presence of the phosphor layer does not impact the dominant wavelength of the device. The small peak caused by emission from the phosphor layer in device b is evident in FIG. 4B. The peak from the phosphor emission has a height of about $2.8 \times 10^{-4}$. The peak from emission from the die has a height of about $3.3 \times 10^{-2}$. The height of the phosphor peak is therefore less than 1% of the height of the die emission peak. In other embodiments, the height of the phosphor peak is less than 10% of the height of the die emission peak.

Figure 5:
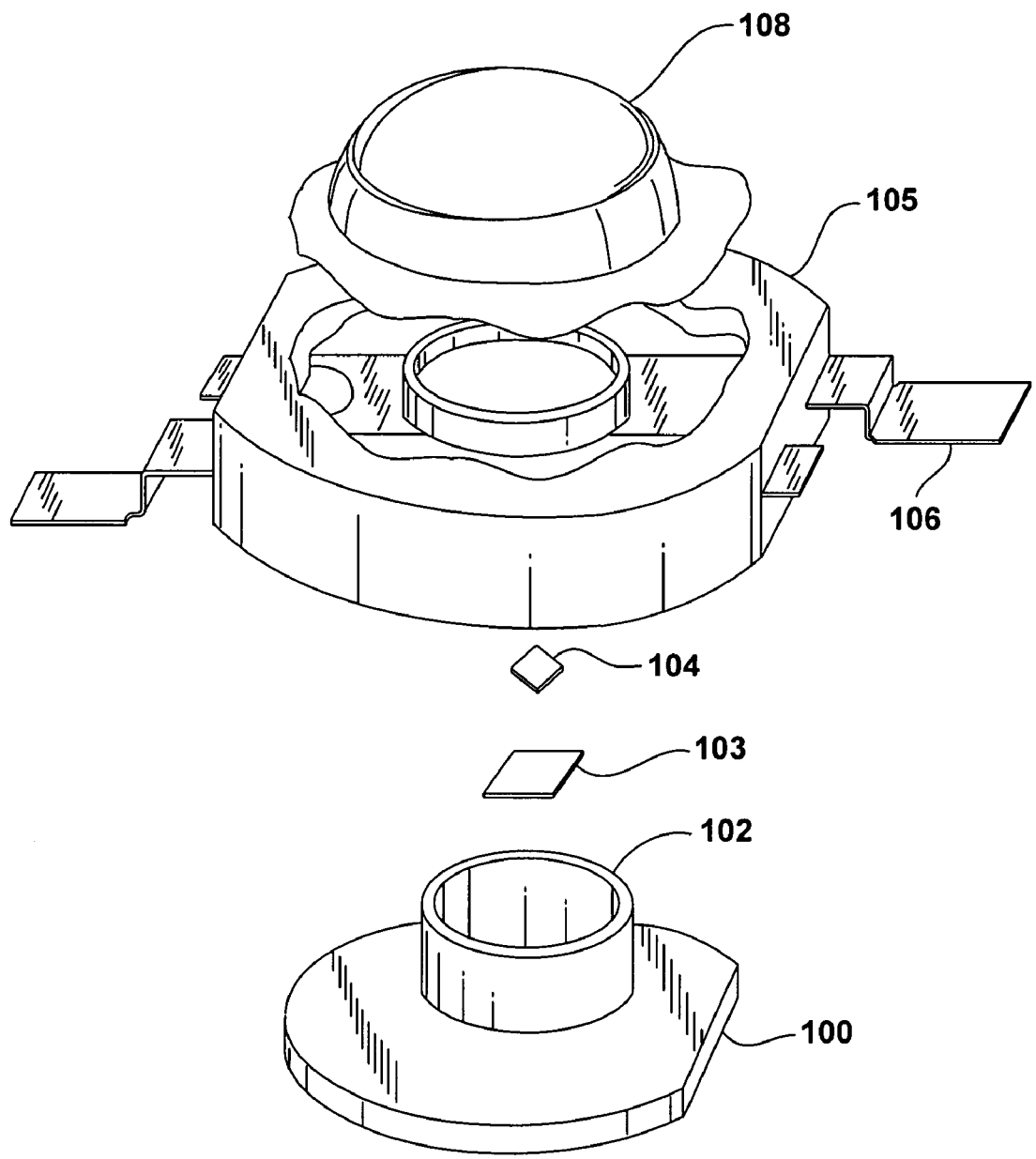
FIG. 5 illustrates a packaged light emitting device.

FIG. 5 is an exploded view of a packaged light emitting device. A heat-sinking slug 100 is placed into an insert-molded leadframe 105. The insert-molded leadframe 105 is, for example, a filled plastic material molded around metal leads 106 that provide an electrical path. Slug 100 may include an optional reflector cup 102. The light emitting device die 104, which may be any of the devices described above, is mounted directly or indirectly via a thermally conducting submount 103 to slug 100. An optical lens 108 may be added.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A structure comprising:
   a semiconductor light emitting device capable of emitting first light having a first peak wavelength; and
   a wavelength converting layer overlying the semiconductor light emitting device, the wavelength converting layer being capable of emitting second light having a second peak wavelength;

wherein a color of combined light emitted by the semiconductor light emitting device and the wavelength converting layer is essentially the same as a color of the first light.

2. The structure of claim 1 wherein a spectral purity of the combined light is greater than or equal to about 50%.

3. The structure of claim 1 wherein a spectral purity of the combined light is greater than or equal to about 90%.

4. The structure of claim 1 wherein:
the combined light has an emission spectrum comprising a first peak corresponding to the first peak wavelength and a second peak corresponding to the second peak wavelength; and
a height of the second peak is less than about 10% of a height of the first peak.

5. The structure of claim 1 wherein:
the combined light has an emission spectrum comprising a first peak corresponding to the first peak wavelength and a second peak corresponding to the second peak wavelength; and
a height of the second peak is less than about 1% of a height of the first peak.

6. The structure of claim 1 wherein the first peak wavelength is between about 400 nm and about 480 nm.

7. The structure of claim 1 wherein the first peak wavelength is between about 420 nm and about 460 nm.

8. The structure of claim 1 wherein the second peak wavelength is between about 500 nm and about 620 nm.

9. The structure of claim 1 wherein a spectral luminous efficacy of the second light is more than twice a spectral luminous efficacy of the first light.

10. The structure of claim 1 wherein the semiconductor light emitting device comprises:
an active region sandwiched between an n-type region and a p-type region, the active region comprising $Al_xIn_yGa_zN$, where $0 \leq x \leq 1$, $0 \leq y \leq 1$, $0 \leq z \leq 1$, $x+y+z=1$.

11. The structure of claim 1 wherein the wavelength converting layer is capable of emitting the second light as a result of absorbing the first light.

12. The structure of claim 1 wherein:
the semiconductor light emitting device comprises:
an active region sandwiched between an n-type region and a p-type region; and
a wavelength converting layer capable emitting first light as a result of absorbing light emitted by the active region; and
the wavelength converting layer capable of emitting second light is capable of emitting the second light as a result of absorbing the first light.

13. The structure of claim 1 wherein:
the semiconductor light emitting device comprises:
an active region sandwiched between an n-type region and a p-type region; and
a wavelength converting layer capable emitting first light as a result of absorbing light emitted by the active region; and
the wavelength converting layer capable of emitting second light is capable of emitting the second light as a result of absorbing light emitted by the active region.

14. The structure of claim 1 wherein the wavelength converting layer comprises a phosphor.

15. The structure of claim 14 wherein the phosphor is selected from the group consisting of YAG:Ce, YAG:Pr+Ce, SrGaS:Eu, (Ca,Sr)S:Eu, CaS:Ce+Mn, (Sr,Li)SiO:Eu, (Ba,Sr)SiO:Eu, and SrSiN:Eu.

16. The structure of claim 14 wherein the phosphor has a thickness between about 1 microns and about 10 microns.

17. The structure of claim 14 wherein the wavelength converting layer further comprises silicate.

18. The structure of claim 17 wherein the wavelength converting layer has a thickness between about 5 microns and about 50 microns.

19. The structure of claim 1 wherein the wavelength converting layer comprises a dye.

20. The structure of claim 19 wherein the dye is selected from the group of Coumarin 6, Fluorol 7GA, Rhodamine 110, and Lumogen.

21. The structure of claim 1 further comprising:
first and second leads electrically connected to the semiconductor light emitting device; and
a lens overlying the wavelength converting layer.

* * * * *

UNITED STATES PATENT AND TRADEMARK OFFICE
CERTIFICATE OF CORRECTION

PATENT NO. : 6,933,535 B2
DATED : August 23, 2005
INVENTOR(S) : Daniel A. Steigerwald et al.

It is certified that error appears in the above-identified patent and that said Letters Patent is hereby corrected as shown below:

Column 6,
Lines 5 and 15, between "capable" and "emitting" insert -- of --.

Signed and Sealed this

Twenty-fourth Day of January, 2006

JON W. DUDAS
*Director of the United States Patent and Trademark Office*